United States Patent [19]

Schuster

[11] Patent Number: 4,978,924

[45] Date of Patent: Dec. 18, 1990

[54] LINEAR SWITCH WITH HIGH OFF-STATE ISOLATION

[75] Inventor: Daniel L Schuster, Portland, Oreg.

[73] Assignee: Magni Systems, Inc., Beaverton, Oreg.

[21] Appl. No.: 343,195

[22] Filed: Apr. 25, 1989

[51] Int. Cl.⁵ .................... H03F 3/45; H03K 17/00
[52] U.S. Cl. .................... 330/254; 328/154; 307/243
[58] Field of Search .................... 330/254; 307/243; 328/154, 160; 329/101–103, 192; 332/31 T; 364/841

[56] References Cited

FOREIGN PATENT DOCUMENTS 754435  8/1980  U.S.S.R. ................... 364/841

*Primary Examiner*—James B. Mullins
*Attorney, Agent, or Firm*—Flehr, Hohbach, Test, Albritton & Herbert

[57] ABSTRACT

A linear switch with high off-state isolation in provided for use in video waveform monitors and/or graphic encoders and mixers. The linear switch provides a proportional mix of two signal sources in response to a control voltage for fading and keying from one source to another in order to allow complete elimination of either source from the output (high isolation when a source is fully off) which can be achieved with minimal circuitry.

4 Claims, 5 Drawing Sheets

FIG.−1

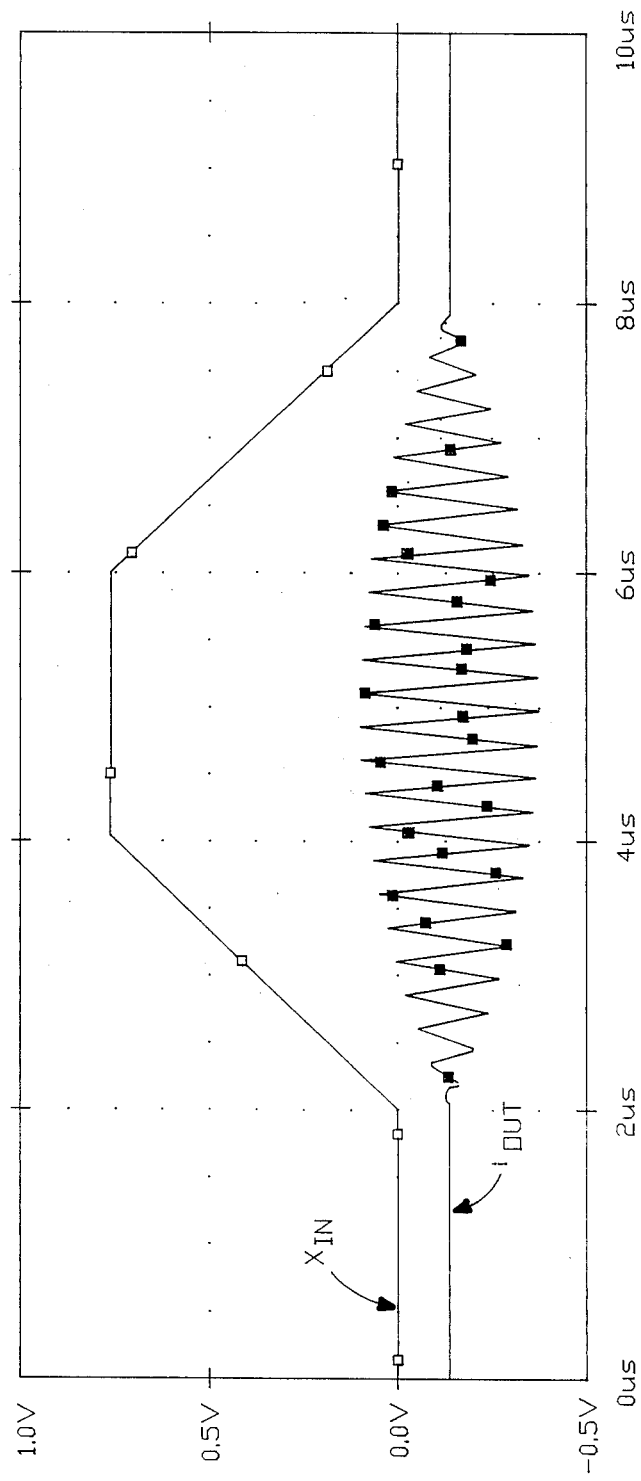
FIG.—5

LINEAR SWITCH WITH HIGH OFF-STATE ISOLATION

BACKGROUND OF THE INVENTION

The present invention relates to a linear switch with high off-state isolation for use in, for example, video waveform monitors, personal computers and/or graphic encoders.

In the prior art, in order to provide linear switching, two 4-quadrant multipliers and a semi-amplifier are needed to implement a linear switch It is generally not possible to achieve high off-state isolation, so that additional non-linear (full-on/full-off) switches are employed to block each signal source when faded to its lowest feedthrough level (off-state). It would be desirable to provide for high isolation capability without the need for additional cut-off switches (such as required in the prior art) which will greatly reduce circuit complexity.

In addition, it would be desirable to provide a linear switch that can be utilized in serving both low end and high end applications (e.g., consumer grade VTR equipment as well as television video signals).

SUMMARY OF THE INVENTION

It is an object of the present invention to provide a linear switch with high off-state isolation and be utilized, for example, in video waveform monitors, personal computers and/or graphic encoders.

In one preferred embodiment, the linear switch according to the present invention provides a sum of two signals proportionately attenuated with respect to a control voltage, i.e., the attenuation of each signal is proportional to the switch control voltage, and the derivative of attenuation with respect to the control voltage (slope) for one signal equals the negative of that (slope) for the other. If the two input signals are identical, the switch output will be essentially independent of control voltage Linear switch output will generally represent a complementary percentage of each signal determined by the control voltage. The linear switch is implemented from a single modified 4-quadrant variable-transconductance multiplier based on, for example, a Gilbert cell) and achieves improved off-state signal isolation by overcoming effects of offset voltages and currents.

The present invention provides a proportional mix of two input signal sources in response to a control voltage, for fading and keying from one source to another, and to allow complete elimination of either source from the output (high off-state isolation when the input source is not selected). The present invention allows this to be achieved with minimal circuitry.

Other objects, features and advantages of this invention will be apparent from the detailed description of the preferred embodiment of this invention as described below, in conjunction with the accompanying drawings.

BRIEF DESCRIPTION OF THE DRAWINGS

The accompanying drawings which are incorporated in and form a part of this specification illustrate an embodiment of the invention and, together with the description, serve to explain the principles of the invention.

FIGS. 2-5 demonstrate the pull-up effect which achieves high off-isolation of the linear switch depicted in FIG. 1.

DETAILED DESCRIPTION OF THE DRAWINGS

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents as may be included within the spirit and scope of the invention as defined by the appended claims.

Figure 1:
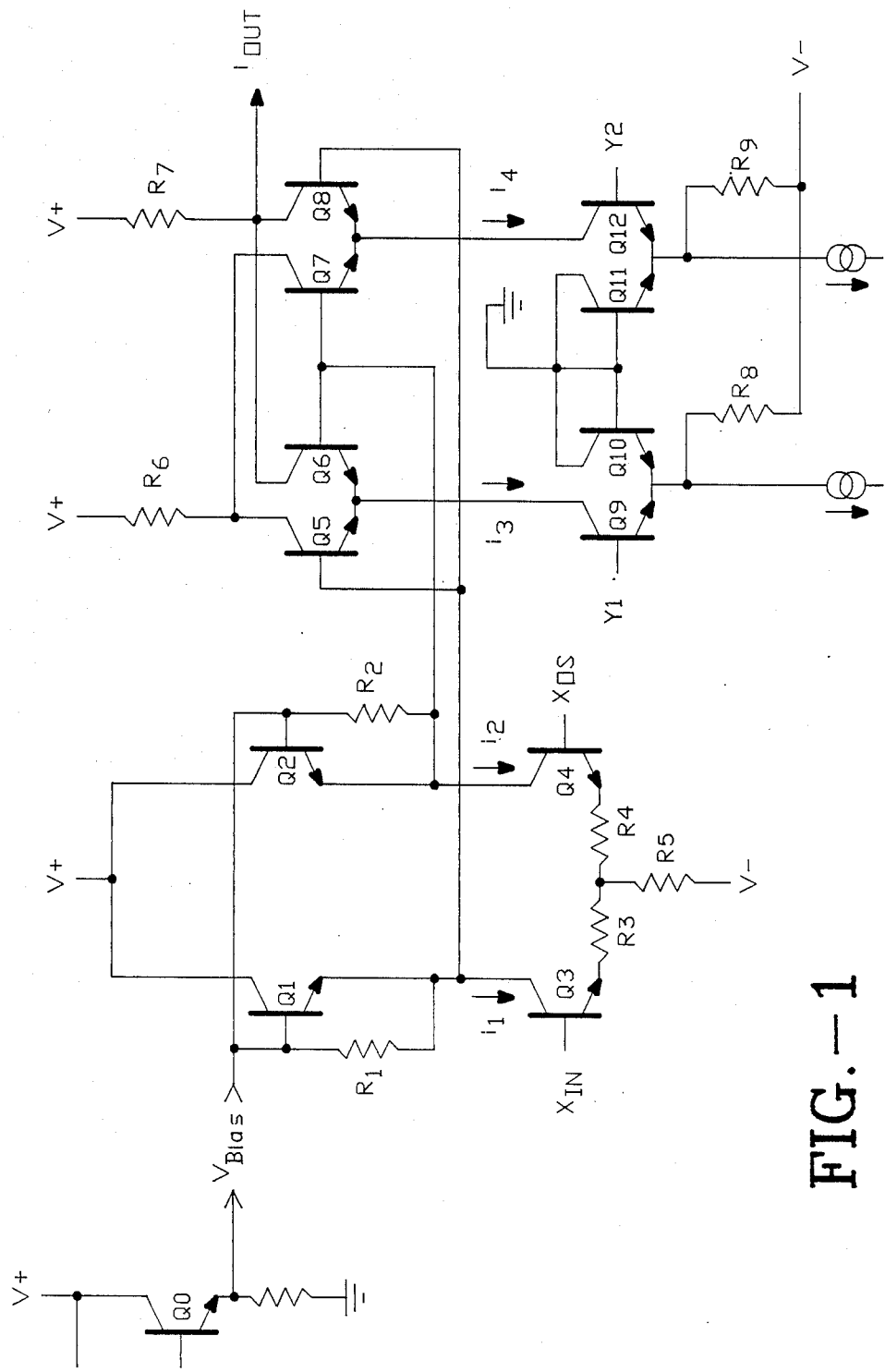
FIG. 1 depicts a schematic diagram of a linear switch circuit according to the present invention.

In FIG. 1, a schematic diagram of a linear switch with high off-state isolation is depicted.

In FIG. 1, resistor R1 is electrically connected between the base and emitter of transistor Q1. Similarly, resistor R2 is electrically connected between the emitter and base of transistor Q2.

The emitter of transistor Q1 is electrically connected to the base of transistor Q5 and to the base of transistor Q8. The emitter of transistor Q2 is electrically connected to the base of transistor Q5 and transistor Q7, Resistor R6 is connected to the collector of transistors Q5, Q7. Resistor R7 is connected to the collector of transistors Q6, Q8.

The switching control voltage XIN is input to the base of transistor Q3 and the voltage XOS is input to the base of transistor Q4. Resistors R3, R4 connect to the emitters of transistors Q3, Q4 respectively, and to resistor R5.

Transistors Q9, Q10 are electrically connected together by their respective emitters. Similarly, transistors Q11, Q12 are electrically connected together by their respective emitters.

Resistor R8 is connected in common electrically to transistors Q9, Q10 and resistor R9 is similarly connected in common to transistors Q11, Q12. Resistors R8, R9 are also connected to voltage V−.

In a conventional variable-transconductance multiplier, R1 and R2 would not be present, and transistor pairs Q1 and Q2 would simply be diodes to balance the Vbe log characteristics of transistors Q5/Q6/Q7/Q8 such that current i1 would be mirrored proportionately by the collector currents of Q5 and Q8, and current i2 would be mirrored proportionately by the collector currents of Q6 and Q7, with currents i1 and i2 complementary and controlled by differential voltage Xin-Xos. Also, Q10 and Q11 would not be present, but the emitters of Q9 and Q12 would be connected by a resistor, such that the differential voltage Y2-Y1 would produce a product current Iout. Ideal Vbe matching of Q1/Q2 and Q5/Q6/Q7/Q8 is required to insure that Iout is zero when differential voltage Xin-Xos is zero, for all values of differential voltage Y2-Y1. Since this is not practically the case even in monolithic implementations of this circuit, some feedthrough of the differential voltage Y2-Y1 will occur when Xin-Xos is zero with nonlinear dependence that cannot be nulled out. The modified variable-transconductance circuit diagrammed in FIG. 1 utilizes Xin as the switching control voltage, with Y1 and Y2 as the two source inputs, which are isolated by Q10 and Q11. The base-emitter voltages of Q11 and Q12 created by Y1 and Y2 control currents i3 and i4, respectively. The relative proportion of currents i3 and i4 that is summed to produce iout is controlled by the ratio of i1 to i2 by virtue of the Gilbert cell arrangement of Q1/Q2 and Q5/Q6/Q7/Q8. Yet minor mismatch in the Vbe's of Q1/Q2 and Q5/Q6/Q7/Q8 would have allowed some contribution of i3, which mirrors i1, to feedthrough to Iout even when i1 approaches zero, were it not for the presence of R1. R1 forces the emitter of Q1 to pull up to the base voltage (Vbias) when i1 reduces below (Vbe@turnon)R1; shutting off Q1 and also Q6 and Q7, so that none of i3 can feedthrough to Iout. R2 serves a similar function in preventing feedthrough of i4 when i2 approaches zero. R1 and R2 can be chosen to have very little effect on the linearity of the proportional summing of i3 and i4 versus control voltage Xin.

The conventional variable-transconductance circuit, which uses diodes in place of Q1 and Q2, cannot achieve the same backbias of Q5/Q6/Q7/Q8 necessary to achieve total isolation, because the diodes will not effectively turn off in the presence of any appreciable bias current. Hence, a principal advantage of the invention is the alternative use of Q1/Q2 with shutoff resistors R1/R2.

FIGS. 2-5 demonstrate the pull-up effect of resistors R1 and R2 of FIG. 1 which achieves the high off-isolation through backbias of Q5/Q6/Q7/Q8. These plots were obtained through numerical simulation using an implementation of the Berkeley SPICE 2 algorithms and the Gummel-Poon model for 2N3904 NPN transistors. The plots agree closely with actual observed waveforms in circuit implementation.

Figure 2:
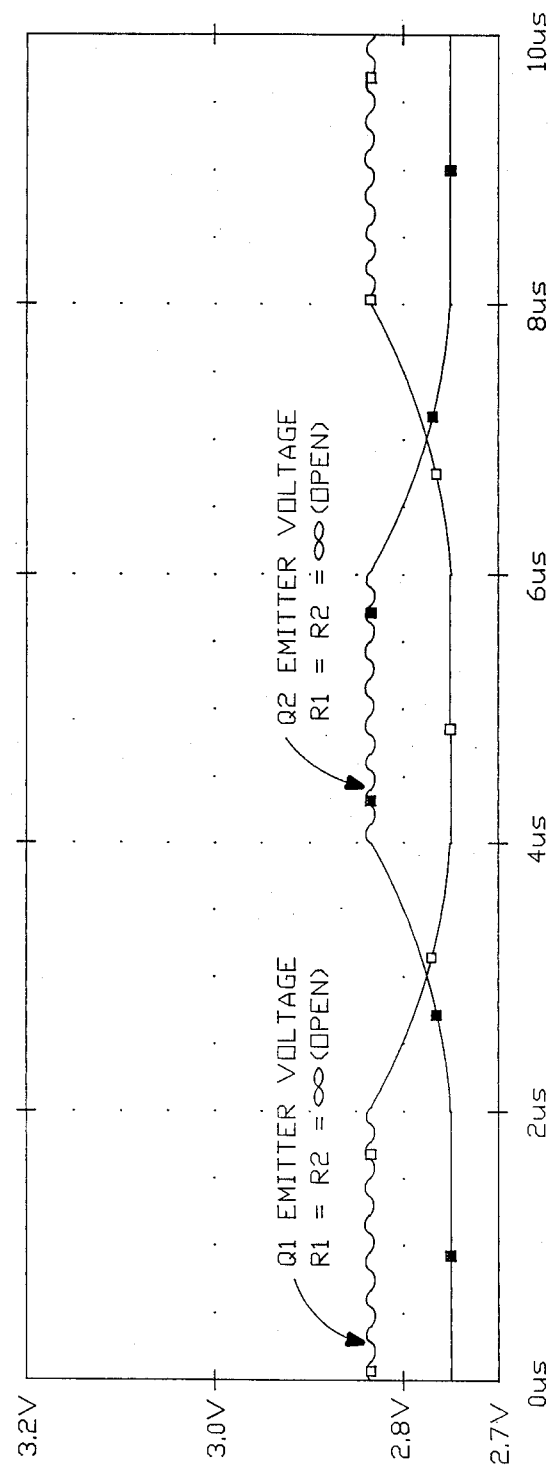
Figure 3:
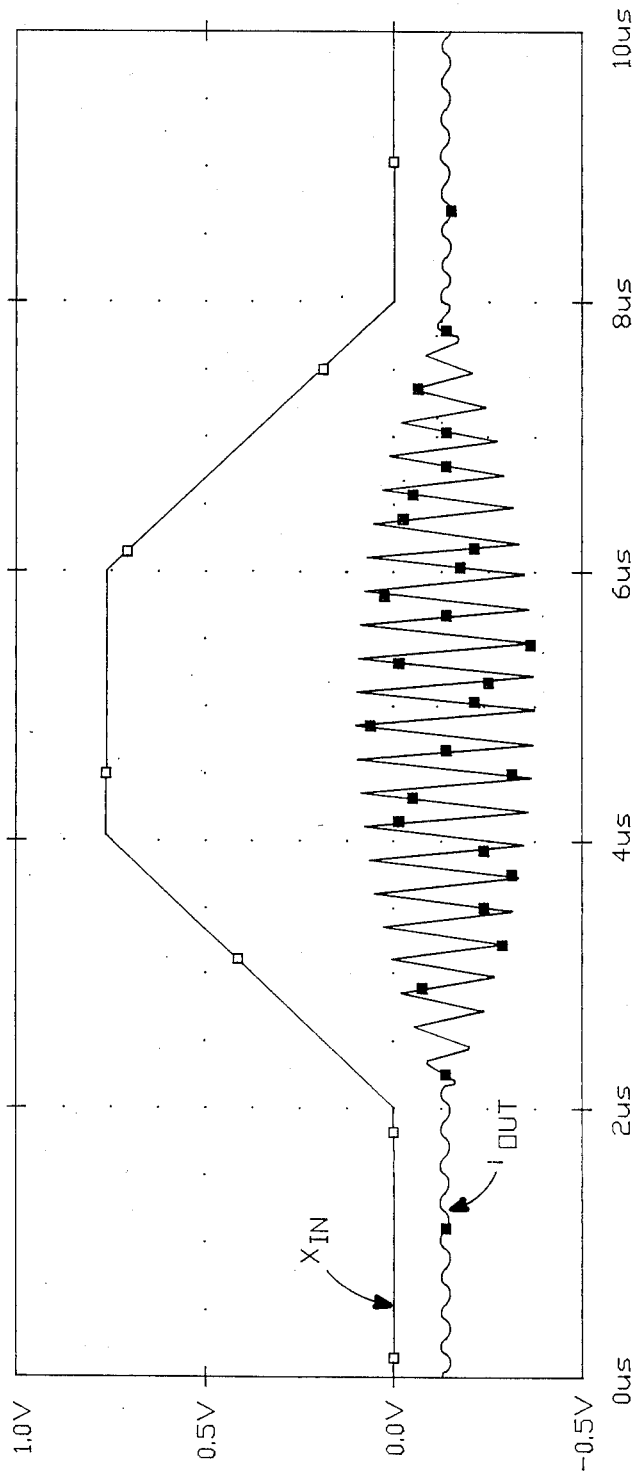

FIGS. 2 and 3 represent the case where R1 and R2 are absent, so that the Q1/Q2 emitter voltages depicted in FIG. 2 represent the same type of voltage variations which would be observed if Q1 and Q2 were replaced by diodes tied to Vbias. Here Xos was chosen to be the midpoint (0.35 V) of the Xin ramp from 0 V to 0.7 V, which represent the extremes where only Y1, or only Y2, should influence I out. Y1 and Y2 were simulated as a 0 V DC source and a 0.5 V amplitude 4.43 MHz sinusoidal source. Note the visible presence of the sinusoidal feedthrough in Iout in the region (Xin=0 V) where none should be present (i.e., the 0V DC source is selected).

Figure 4:
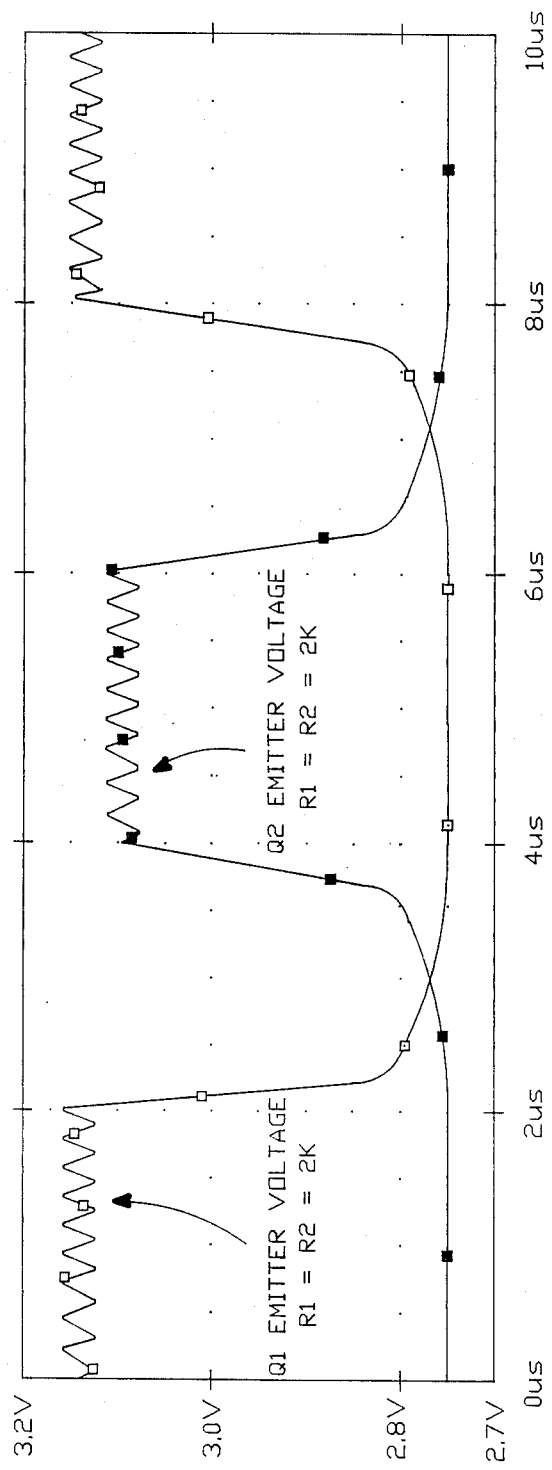

FIGS. 4 and 5 represent the identical case, except R1 and R2 have been added to provide the pull-up effect, back-biasing Q5/Q6/Q7/Q8. Note the absence of sinusoidal feedthrough in Iout in the region (Xout=0 V) where it was present in FIG. 3. Note also that the logarithmic responses of Q1/Q2 emitter voltages in FIG. 4 are similar, while Q1 and Q2 are conducting, to the responses in FIG. 2, since the incremental emitter resistance is small relative to the values of R1/R2. The difference occurs when emitter current in Q1 or Q2 approaches zero, and the incremental emitter resistance becomes large relative to R1/R2.

The incremental emitter resistance of Q1/Q2 is inversely proportional to emitter current, so that it effectively becomes "infinite" as emitter current approaches zero, in attempting to maintain the emitter voltage at the Vbe below Vbias. However, when the incremental resistance of Q1 or Q2 greatly exceeds the value of R1 or R2 (respectively), which occurs at low emitter currents, R1 or R2 (respectively) acts as a shunt and Q1 or Q2 effectively becomes nonconducting.

Thus, as Q3 or Q4 collector currents approach zero, effectively all current flows through R1 or R2, respectively, and the Q1 or Q2 emitter voltage approaches Vbias (about 3.2 V in these plots), with the Q1 or Q2 base-emitter voltage drop approaching zero. This creates the needed backbias for Q5/Q6/Q7/Q8 to insure high isolation in spite of Vbe mismatches.

Similar results could be obtained if Q1 and Q2 were replaced with resistor-shunted, monolithically-matched diodes with anodes connected to Vbias.

The linear circuit according to the present invention reduces cross talk between video signals and graphics such as generated by encoders. The present invention can be utilized to service both high end and low end applications, as previously described.

The preferred embodiment was chosen and described in order to best explain the principles of the invention and its practical applications to thereby enable others skilled in the art to best utilize the invention and various embodiments and with various modifications as are suited to the particular use contemplated. It is intended that the scope of the invention be defined only by the claims appended hereto.

What is claimed is:

1. A linear switch comprising
   transistor means for generating first and second control currents to produce an output current, said transistor means including first, second and third transistor pairs arranged in a Gilbert cell type arrangement, where each transistor of said first transistor pair includes a shutoff resistor to provide high isolation between currents in said second and third transistor pairs.

2. A linear switch having an output, said switch comprising
   means for providing a first switching control voltage,
   means for providing first and second voltage source inputs,
   first transistor means for electrically isolating said first and second inputs from the linear switch output,
   second transistor means for generating first and second control currents to produce an output current, said first and second transistor means arranged in a Gilbert cell type arrangement, said first transistor means including shutoff voltage means for providing high isolation between said voltage source inputs and said output current.

3. A linear switch having an output, said switch comprising
   means for providing a first switching control voltage,
   means for providing first and second voltage source inputs,
   first transistor means including a first transistor pair for electrically isolating said first and second inputs from the linear switch output,
   second transistor means for generating first and second control currents to produce an output current, said second transistor means including second and third transistor pairs arranged in a Gilbert cell type arrangement with said first transistor pair, where said first transistor pair includes resistor means to develop a shutoff voltage to achieve a high isolation between said first and second voltage source inputs and said output current.

4. A switch as in claim 3 wherein the relative proportion of said first and second currents is controlled by the ratio of the currents of said first transistor pair.

* * * * *